(12) United States Patent
Krasikov

(10) Patent No.: US 11,289,915 B2
(45) Date of Patent: Mar. 29, 2022

(54) METHOD AND APPARATUS FOR OPERATING A PHOTOVOLTAIC DEVICE

(71) Applicant: First Solar, Inc., Tempe, AZ (US)

(72) Inventor: Dmitry Krasikov, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 27 days.

(21) Appl. No.: 17/013,257

(22) Filed: Sep. 4, 2020

(65) Prior Publication Data
US 2021/0075219 A1 Mar. 11, 2021

Related U.S. Application Data

(60) Provisional application No. 62/896,258, filed on Sep. 5, 2019.

(51) Int. Cl.
*H02J 3/38* (2006.01)
*H01L 31/0296* (2006.01)

(52) U.S. Cl.
CPC ........ *H02J 3/381* (2013.01); *H01L 31/02963* (2013.01); *H02J 2300/26* (2020.01)

(58) Field of Classification Search
CPC .......... H02J 3/38; H02J 3/381; H02J 2300/26; H01L 31/0296; H01L 31/02963
See application file for complete search history.

*Primary Examiner* — Robert L Deberadinis
(74) *Attorney, Agent, or Firm* — MacMillan, Sobanski & Todd, LLC

(57) ABSTRACT

The efficiency of a photovoltaic device is enhanced by operating the device in a dark bias mode during a dark period, and in a power generation mode during a subsequent illuminated period. The dark period occurs when an insufficient amount of irradiance is received by the photovoltaic device to produce a useful amount of generated power. In the dark bias mode, a forward DC biasing current is applied to the photovoltaic device, and the device consumes a small current. In the power generation mode, the forward bias is not applied to the photovoltaic device, and the photovoltaic device generates a current in a direction opposite to that of the forward biasing current that was applied during the preceding dark period.

20 Claims, 9 Drawing Sheets

METHOD AND APPARATUS FOR OPERATING A PHOTOVOLTAIC DEVICE

CROSS-REFERENCE TO RELATED APPLICATIONS

This application claims priority from U.S. Provisional Patent Application No. 62/896,258, filed on Sep. 5, 2019, which is incorporated by reference herein in its entirety for all purposes.

BACKGROUND

Photovoltaic devices are subjected to illuminated conditions to generate power. When photovoltaic modules are exposed to dark conditions, they can exhibit a dark soak effect which causes a variance in efficiency during subsequent daylight operation. Thus, it would be advantageous to provide methods and systems for operating photovoltaic devices which improve the efficiency of the photovoltaic devices when exposed to cycles of dark conditions and illuminated conditions.

BRIEF DESCRIPTION OF THE DRAWINGS

These and additional features provided by the embodiments described herein will be more fully understood in view of the following detailed description, in conjunction with the drawings.

DETAILED DESCRIPTION

Provided herein are systems and methods for improving the efficiency of photovoltaic devices. The embodiments provided can yield a net gain in energy yield by applying a forward bias to a photovoltaic device when the photovoltaic device is not generating power. Various embodiments of the systems and methods will be described in more detail herein.

Figure 1:
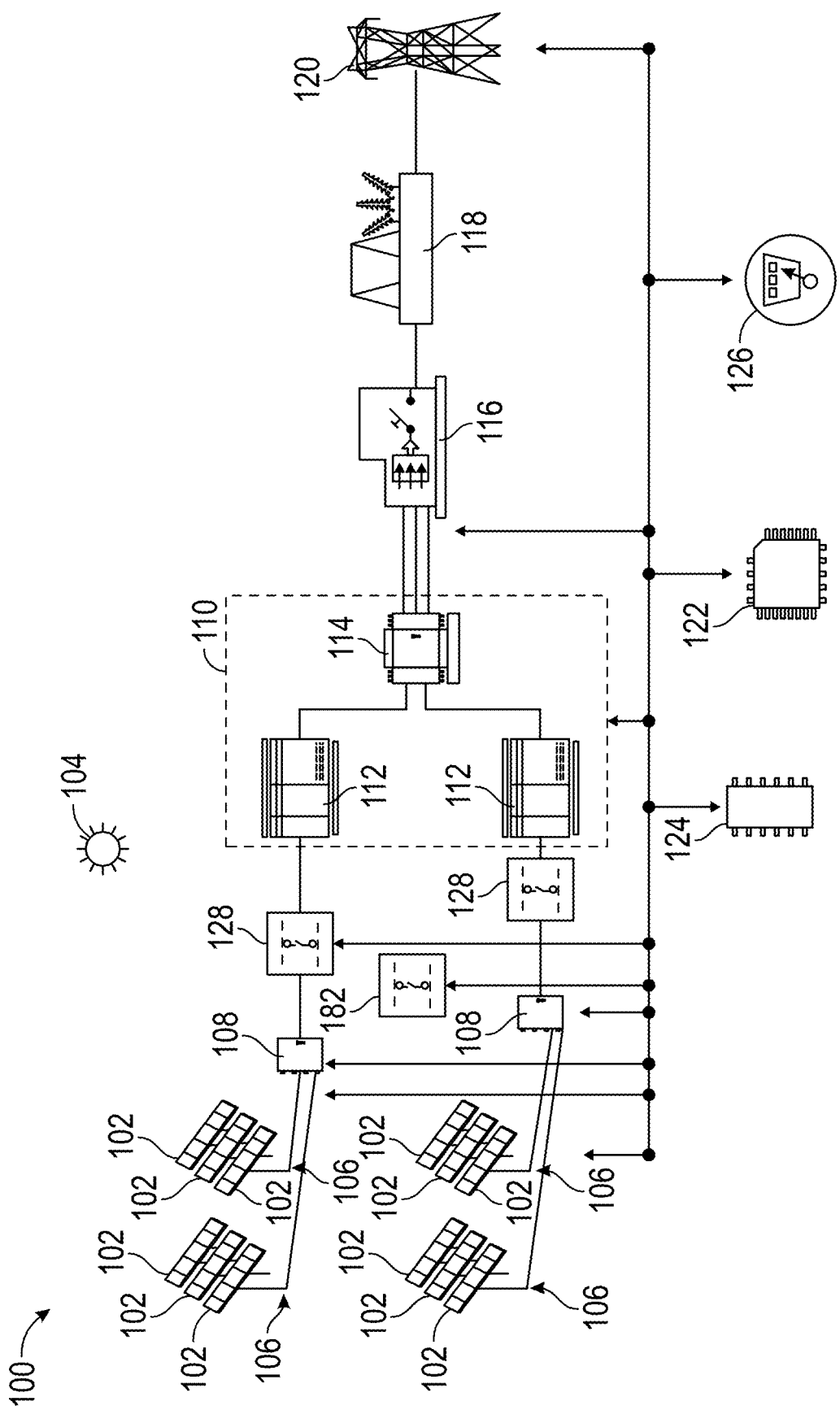
FIG. 1 schematically depicts a system for operating a photovoltaic device according to one or more embodiments shown and described herein.

FIG. 1 depicts an exemplary system 100 for operating a photovoltaic device 102. Specifically, the system 100 can be configured as a solar power plant operable to transform light generated by the sun 104 into electrical power. It should be understood that the system 100 is simplified to show representative components as, in practice, the system 100 typically includes pluralities of the depicted components. Furthermore, while the system 100 can be utilized as a solar power plant, the systems and methods described herein can be configured for residential or commercial usage.

The system 100 includes a plurality of photovoltaic devices 102, each depicted as a photovoltaic device 102, and each operable to transform solar energy into electrical power. Electrical interconnections among the plurality of photovoltaic devices can be provided to manage the power output generated by each photovoltaic device 102. For example, groups of two or more photovoltaic devices can be electrically connected to form one or more strings 106. Each of the strings 106 includes a plurality of photovoltaic devices 102 that are connected in parallel or in series, or in any of various parallel-serial combinations, such that each string of the strings 106 outputs a desired current and/or voltage. Multiple strings 106 of photovoltaic devices 102 can be connected at a combiner box 108.

The combiner box 108 combines DC electrical power received from the multiple strings 106, and transmits the combined DC electrical power to a power conversion station (PCS) 110. The PCS 110 performs DC to AC power conversion using, for example, an inverter 112. The PCS 110 can then increase the AC voltage output from the inverter 112 using a transformer 114. The output power of multiple PCSs 110 is supplied to a photovoltaic combining switchgear (PVCS) 116.

The inverters 112 of the multiple PCS's 110 control the DC power output of the strings 106 by modulating voltage. For example, the inverters 112 can be controlled using a maximum power point (MPP) tracking algorithm. Accordingly, the inverters 112 can provide a fast response time to automatically control AC output. Utility scale inverters include, for example, Power Electronics HEC-US V1500 and SMA Sunny Central 750CP-US. However, other inverters could also be used.

The PVCS 116 combines the output power from the multiple PCSs 110 and increases the current provided by the multiple PCSs 110 in a manner analogous to that of the combiner boxes 108 combining electrical power from the strings 106. Additionally, the PVCS 116 can include fused switch gear and metering transformers for monitoring current and voltage levels. The PVCS 116 can transmit the output power to a substation 118 via a set of one or more collector lines, which can have an increased wire diameter, and/or greater current carrying capacity, compared to the feeder lines.

The substation 118 can serve as a point of common coupling between the system 100 and a power grid 120. Specifically, the substation 118 can be connected to a set of transmission lines of the power grid 120. Since this set of transmission lines can traverse a much larger distance than the runs of the system 100, the substation 118 can operate to step up the voltage of the power received via the set of one or more collector lines. The substation 118 can include transformers that step up the voltage to a level suitable for the power grid 120 voltage specified for the transmission line. Accordingly, the power grid 120 can dictate the output of the substation 118. Additionally, the substation 118 can include current and voltage metering equipment to monitor the amount of power supplied by the system 100 to the power grid 120.

As an example, in a typical solar power plant installation, multiple strings 106 of about 1.5 kV each can be connected in parallel to the PCS 110 via a larger conductor. At the PCS 110, the inverter 112 can convert the voltage during the conversion step from about 1.5 kV DC to about 600 V AC. A second function of the PCS 110 can be to increase the AC voltage output from the inverter 112, using the transformer 114, to about 34.5 kV AC. Each PCS 110 can be rated to output between about 1.6 MW AC and about 4 MW AC, for example. The output of multiple PCS's 110 can be supplied to the PVCS 116. Each PVCS 116 can be rated to output between about 30 MW AC and about 40 MW AC. The substation 118 can include transformers that step up the voltage from 34.5 kV to between about 69 kV to about 765 kV, for example, depending on the voltage specified for the transmission line of the power grid 120.

Components of the system 100 can be communicatively coupled to at least one processor 122 and a memory 124. As used herein, the term "communicatively coupled" means that the components are capable of exchanging data signals with one another such as, for example, electrical signals via a conductive medium, electromagnetic signals via air, optical signals via optical waveguides, or the like.

According to the embodiments described herein, the term "processor" means any device capable of executing machine-readable instructions. Accordingly, the processor 122 can be a controller (e.g., programmable logic controller (PLC) or proportional-integral-derivative controller (PID controller), an integrated circuit, a microchip, a computer, or any other computing device. The processor 122 can be configured to execute logic or software and perform functions that control the inverters 112. Specifically, the processor 122 can be communicatively coupled to the memory 124, with the memory 124 being configured to store the logic and/or input received by the processor 122. The memory 124 described herein can be RAM, ROM, a flash memory, a hard drive, a non-transitory computer-readable medium, or any device capable of storing machine-readable instructions.

Embodiments of the present disclosure may comprise logic that includes machine-readable instructions or an algorithm written in any programming language of any generation (e.g., 1GL, 2GL, 3GL, 4GL, or 5GL) such as, e.g., machine language that can be directly executed by the processor 122, or assembly language, object-oriented programming (OOP), scripting languages, microcode, etc., that can be compiled or assembled into machine readable instructions and stored on a machine-readable medium. Alternatively, the logic or algorithm can be written in a hardware description language (HDL), such as logic implemented via either a field-programmable gate array (FPGA) configuration, an application-specific integrated circuit (ASIC), or their equivalents. Accordingly, the logic can be implemented in any conventional computer programming language, as pre-programmed hardware elements, or as a combination of hardware and software components.

The system 100 can include manually generated supervisory control and data acquisition (SCADA) or automated generation control (AGC) inputs that define power set points or other grid operator control functions. The SCADA inputs, the AGC inputs, or both can be received by the processor 122. Accordingly, the processor 122 can execute functions based at least in part upon the SCADA inputs, the AGC inputs, or both.

The system 100 can include one or more power sensors 126. The power sensors 126 can be configured to detect power input, power output, voltage, or any combination thereof of any of the photovoltaic device 102, the strings 106, the combiner box 108, the inverter 112, the transformer 114, or any combination thereof. Alternatively or additionally, the power sensors 126 can be configured to receive information about grid conditions, such as DC or AC energy meters, current density, and voltage meters. The power sensors 126 can be placed in multiple locations throughout the system 100 to detect and monitor power conditions.

Figure 2B:
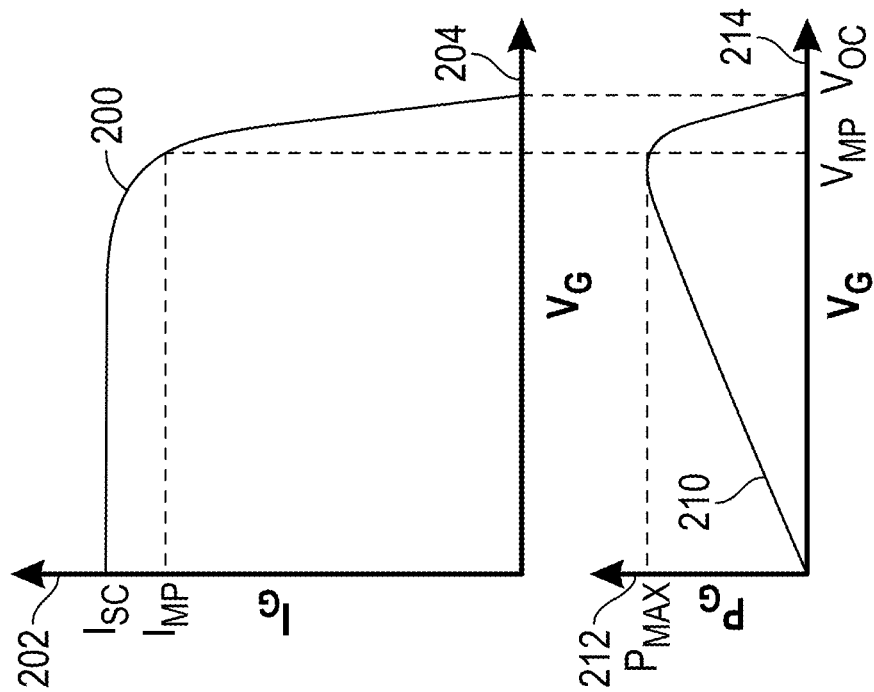
FIG. 2B shows an exemplary current-voltage (IV) curve and a corresponding graph of power versus voltage for the photovoltaic device of FIG. 2A.
Figure 2A:
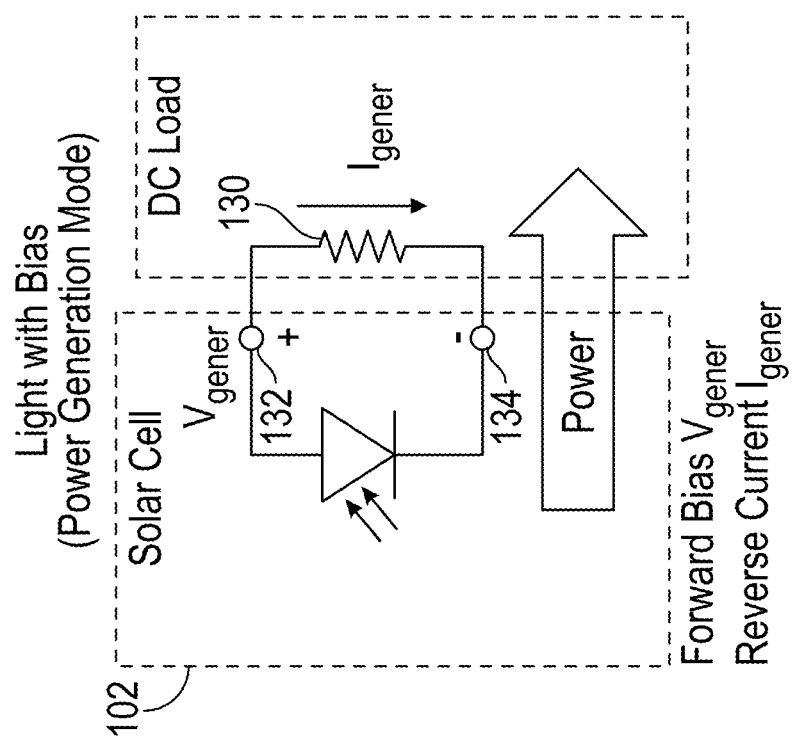
FIG. 2A is a simplified electronic model of a photovoltaic device under illumination.

FIG. 2A is a simplified electronic model of a photovoltaic device under illumination, and FIG. 2B shows an exemplary current-voltage (IV) curve and a corresponding graph of power versus voltage for the photovoltaic device of FIG. 2A. Referring collectively to FIGS. 2A and 2B, the photovoltaic device 102, when under illumination, provides a generated power $P_G$ to a load 130 across a first terminal 132 and a second terminal 134. Under these conditions, a generated voltage $V_G$, and a generated current $I_G$ in a first direction (reverse diode current), are generated by the photovoltaic device 102 across the first terminal 132 and the second terminal 134. The generated voltage $V_G$ and the generated current $I_G$ are represented graphically as a current-voltage (IV) curve 200 with the generated current $I_G$ increasing along the y-axis 202, and the generated voltage $V_G$ increasing along the x-axis 204.

A power curve 210 graphically represents the generated power $P_G$, with the generated power $P_G$ increasing along the y-axis 212 and the generated voltage $V_G$ increasing along the x-axis 214. The x-axis 204 and the x-axis 214 are spatially aligned such that the IV curve 200 and the power curve 210 correspond to one another. The IV curve 200 intersects the y-axis 202 when the generated current $I_G$ is equal to a short-circuit current $I_{SC}$ of the photovoltaic device 102. The short circuit current $I_{SC}$ is indicative of the maximum current of the photovoltaic device 102, and occurs when the load 130 is short-circuited and the generated power $P_G$ is substantially zero. The IV curve 200 intersects the x-axis 204 when the generated voltage $V_G$ is equal to an open circuit voltage $V_{OC}$. The open circuit voltage $V_{OC}$ is indicative of a maximum voltage of the photovoltaic device 102, and occurs when the load 130 is open-circuited and the generated power $P_G$ is substantially zero.

Referring collectively to FIGS. 1, 2A, and 2B, the short circuit current $I_{SC}$ is substantially proportional to irradiance of the sun 104. However, irradiance has a comparatively small effect on the open circuit voltage $V_{OC}$. Irradiance levels can decrease due to factors such as clouds, haze, dust, shadows, or when the sun 104 is near the horizon. In operation, the product of the generated current $I_G$ and the generated voltage $V_G$ corresponds to the generated power $P_G$. Accordingly, a maximum generated power $P_{MAX}$ of the power curve 210 corresponds to a location of the IV curve 200 that yields the largest product of the generated current $I_G$ and the generated voltage $V_G$. The generated voltage $V_G$, when the generated power $P_G$ equals the maximum generated power $P_{MAX}$, is referred to as a maximum power voltage $V_{MP}$. The generated current $I_G$, when the generated power $P_G$ equals the maximum generated power $P_{MAX}$, is referred to as a maximum power current $I_{MP}$.

Deviations in the generated voltage $V_G$ from the maximum power voltage $V_{MP}$, and deviations in the generated current $I_G$ from the maximum power current $I_{MP}$, generally decrease the generated power $P_G$ with respect to the maximum generated power $P_{MAX}$. Accordingly, the system 100 is generally configured to employ some form of maximum power tracking. For example, one or more processors 122 associated with the inverters 112 can execute maximum power tracking algorithms to adjust the load 130 to automatically track the generated power $P_G$ with the maximum generated power $P_{MAX}$.

Figure 3B:
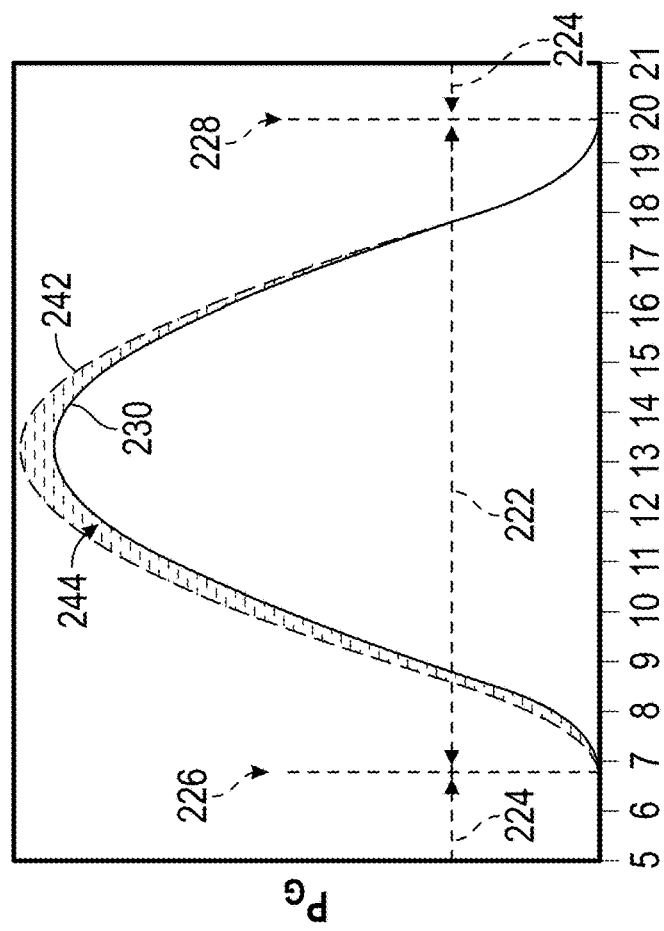
FIG. 3B is a graph showing power generated by a photovoltaic device as a function of time for a 16-hour period.
Figure 3A:
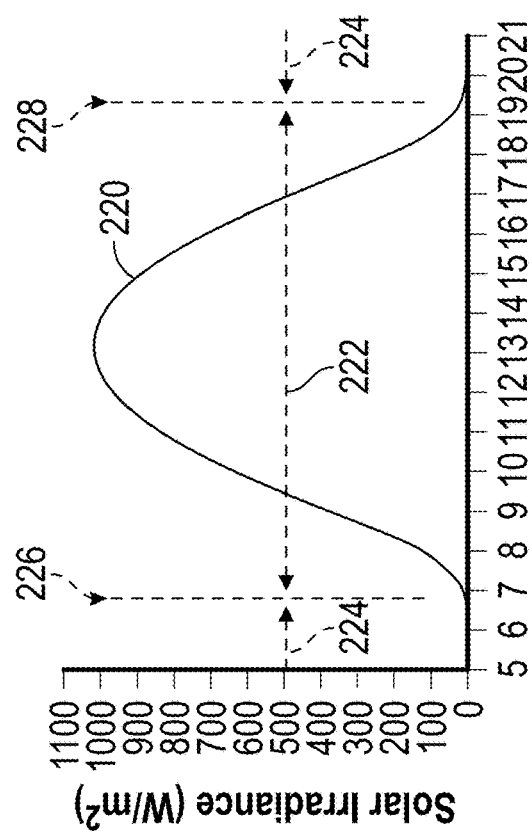
FIG. 3A is a graph showing solar irradiance incident on a photovoltaic device as a function of time for a 16-hour period.

FIG. 3A is a graph showing solar irradiance incident on a photovoltaic device as a function of time for a 16-hour period, and FIG. 3B is a graph showing power generated by a photovoltaic device as a function of time for a 16-hour period. Referring collectively to FIGS. 1, 3A, and 3B, the generated power $P_G$ of the photovoltaic device 102 varies throughout a day due to contributions from various factors such as, but not limited to, variations of solar irradiance, and variations of the temperature of the photovoltaic device 102. For example, an increase in temperature during relatively warm mid-day hours can cause efficiency reductions on the order of about 10%. The amount of solar irradiance received by each photovoltaic device 102 from the sun 104 can vary based upon the relative motion of the photovoltaic device 102 and the sun 104 throughout the day. The received solar irradiance is represented by an irradiance curve 220. The irradiance curve 220 spans an illuminated period 222, which corresponds to a first period of time where a sufficient amount of solar irradiance is received by the photovoltaic device 102 to provide generated power $P_G$, and a dark period 224, which corresponds to a second period of time where an insufficient amount of solar irradiance is received by the photovoltaic device 102 for useful operation.

In some instances, the end of the dark period 224 and the start of the illuminated period 222 can be demarcated by a sunrise 226. Similarly, the end of the illuminated period 222 and the start of the dark period 224 can be demarcated by a sunset 228. As noted previously, the generated power $P_G$ of the photovoltaic device 102 can vary in response to the received solar irradiance. For example, a power output curve 230 depicting the generated power $P_G$ of the photovoltaic device 102 in response to solar irradiance corresponding to the irradiance curve 220 is provided in FIG. 3B.

Figures 4, 5:
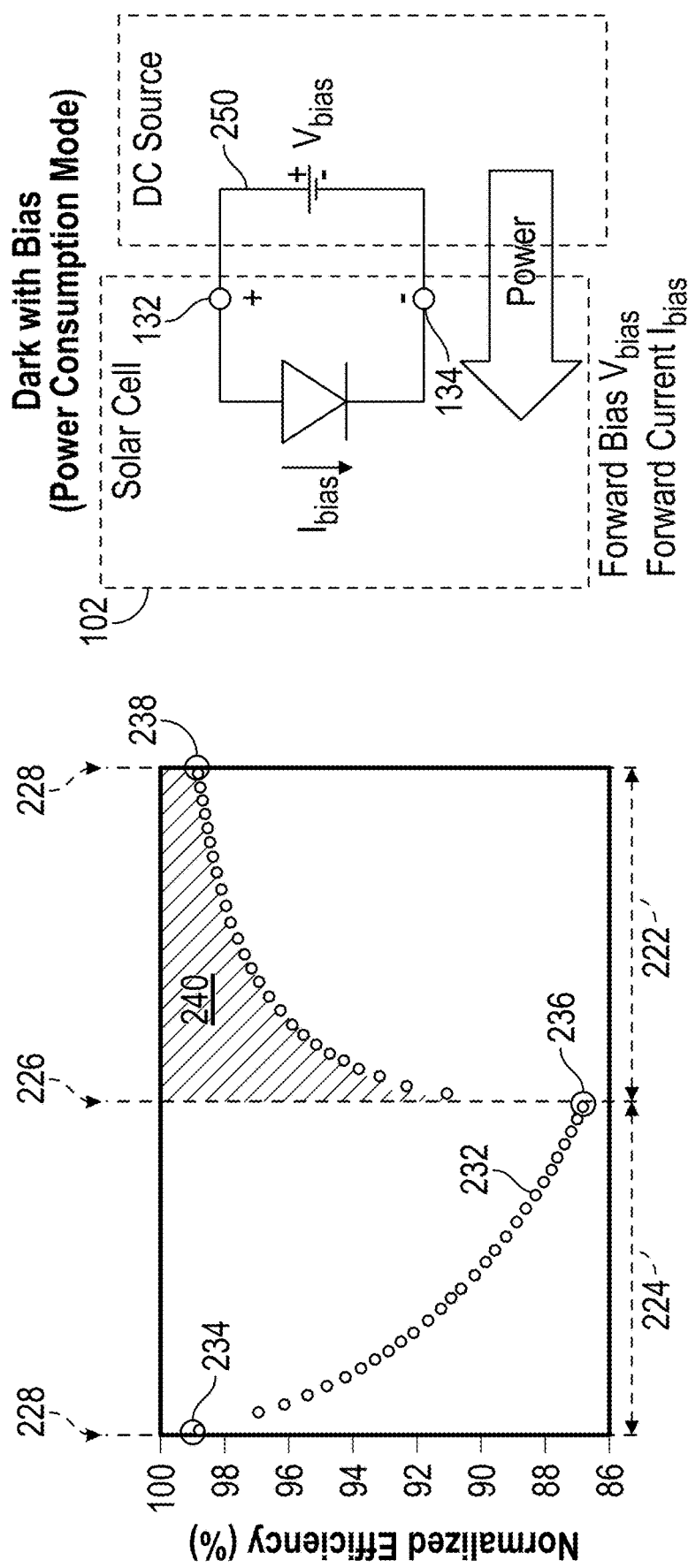
FIG. 4 is a graph of normalized efficiency versus time for a photovoltaic device.
FIG. 5 is a simplified electronic model illustrating a forward DC bias being applied to a photovoltaic device during a dark period in accordance with one or more embodiments shown and described herein.

FIG. 4 is a graph of normalized efficiency versus time for a photovoltaic device. Referring collectively to FIGS. 1, 3B, and 4, the generated power $P_G$ of the photovoltaic device 102 is reduced by a dark soak effect. The dark soak effect results in an observed reduction in efficiency during the illuminated period 222 that is gradually mitigated as the illuminated period 222 progresses. Essentially, the photovoltaic device 102 exhibits a slow wake-up after the dark period 224 ends. The photovoltaic device 102 exhibits a variance in efficiency under real day/night conditions due to this dark soak effect. For example, a normalized efficiency 232 of the photovoltaic device 102 is graphically depicted in FIG. 4. The normalized efficiency 232 is corrected for temperature effects. At the beginning of the dark period 224, which can align with the sunset 228, the normalized efficiency 232 is a relatively high efficiency 234. Solely for purposes of illustration, the efficiency could be 99%. As the dark period 224 progresses, the normalized efficiency 232 decreases towards a relatively low efficiency 236. In the present example, this low efficiency is 87%. In general, the duration of time without exposure to solar irradiance (i.e., dark soak) can cause the normalized efficiency 232 to decay during the dark period 224.

The decay in normalized efficiency 232 from the relatively high efficiency 234 at the beginning of the dark period 224 to the relatively low efficiency 236 at the end of the dark period 224 is not instantaneously recovered at sunrise 226. Instead, the normalized efficiency 232 gradually increases during the illuminated period 222 from the relatively low efficiency 236 to the relatively high efficiency 238. The gradual increase in efficiency results in a net loss of efficiency 240 during the illuminated period 222 compared to an idealized device, i.e., a device without any loss in efficiency due to dark soaking.

Referring again to FIGS. 3A and 3B, a first power curve 242 (FIG. 3B) corresponding to the generated power $P_G$ of the idealized device (disregarding any dark soak effect) responsive to solar irradiance represented by the irradiance curve 220 (FIG. 3A) can be compared to a second power curve 230 (FIG. 3B). An area 244 between the first power curve 242 and the second power curve 230 is indicative of a loss in generated power $P_G$ of the photovoltaic device 102 due to the dark soak effect. In practice, the dark soak effect can cause up to about a 10% loss of the generated power $P_G$ of the photovoltaic device 102.

Referring collectively to FIGS. 1, 3B, and 4, without being bound to theory, it is believed that the loss in normalized efficiency 232 during the dark period 224, corresponds to slow, reversible efficiency transients in the photovoltaic device 102 during night-to-day operational cycles. As described previously, these relatively slow transients, which can last for several hours, can result in the net loss of efficiency 240 and loss in generated power $P_G$ during operation in the subsequent illuminated period 222. The magnitude and the rate of these reversible transients can differ for different types of photovoltaic devices, such as between photovoltaic devices having different solar cell compositions, and for different ambient temperatures. Some types of photovoltaic devices demonstrate weak transients, while other types of photovoltaic devices demonstrate efficiency changes of several percent under typical operation. The embodiments provided herein, relate to mitigating the efficiency decay during the dark period 224, which can in turn reduce the net loss of efficiency 240 and loss in generated power $P_G$ during operation in the illuminated period 222.

FIG. 5 is a simplified electronic model illustrating a forward DC bias $V_{BIAS}$ 250 (FIG. 5) being applied to the photovoltaic device 102. The Applicants have discovered that the net loss of efficiency 240 (FIG. 4) of the photovoltaic device 102 (FIGS. 1 and 5) due to the dark soak effect can be suppressed or substantially eliminated by applying a forward bias $V_{BIAS}$ 250 (FIG. 5) to the photovoltaic device 102 during the dark period 224 (FIGS. 3A and 3B). The forward bias $V_{BIAS}$ 250 (FIG. 5) is applied across the first terminal 132 and the second terminal 134 to provide a forward biasing current $I_{BIAS}$ (forward diode current) that flows through the photovoltaic device 102 in a second direction opposite to that of the first direction of the generated current $I_G$ during the illuminated period 222. This situation is roughly analogous to the charging of a rechargeable battery using an external power source having a higher voltage than the voltage of the rechargeable battery.

The dark period 224 may be defined, for example, to include night hours between sunset 228 and sunrise 226, or otherwise when the photovoltaic device 102 is exposed to a dark condition. A dark condition refers to any situation where the photovoltaic device 102 lacks exposure to a sufficient amount of solar irradiance and thus cannot achieve a useful level of operation. A net energy gain is achieved by applying the forward bias $V_{BIAS}$ 250 to the photovoltaic device 102 during the dark period 224. Thus, the energy cost of applying the forward bias $V_{BIAS}$ 250 during the dark period 224 is less than the energy gain from the resulting efficiency improvement for the photovoltaic device 102 during the subsequent illuminated period 222, yielding a net energy gain. The applied forward bias $V_{BIAS}$ 250 can be a substantially constant DC voltage applied throughout the dark period 224.

Figure 6:
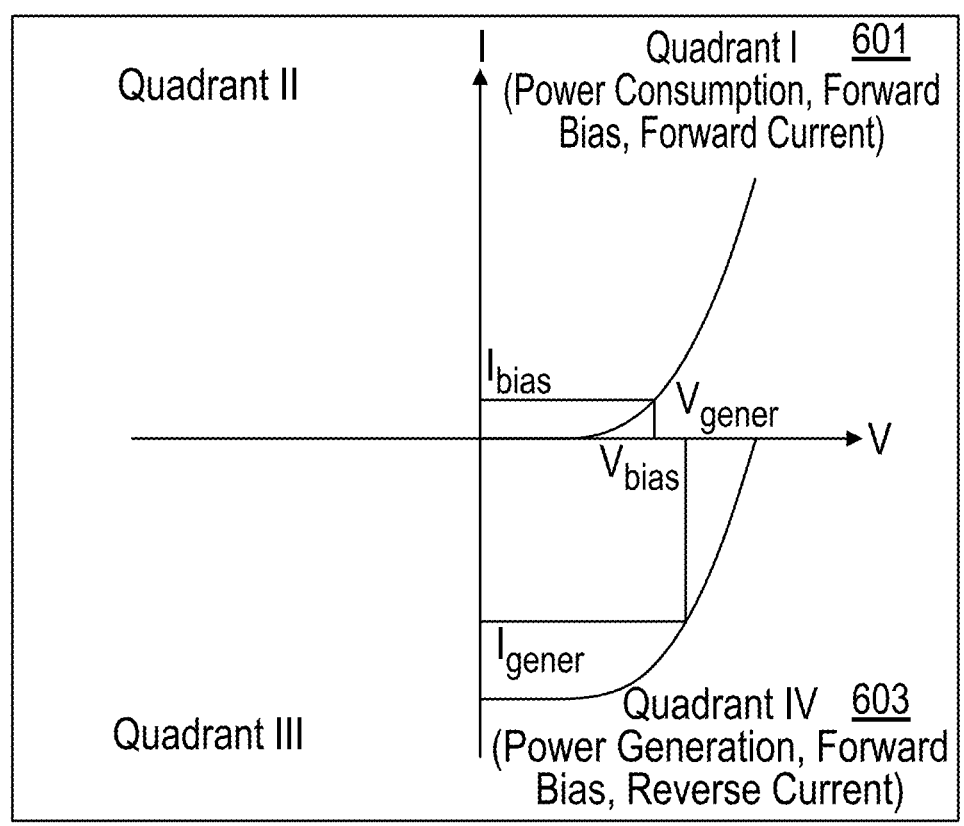
FIG. 6 is a power quadrant diagram for the photovoltaic device of FIGS. 2A and 5.

FIG. 6 is a power quadrant diagram for the photovoltaic device 102 of FIGS. 2A and 5. When the photovoltaic device 102 (FIG. 2A) is in a power generation mode during the illuminated period 222 (FIGS. 3A and 3B), the photovoltaic device operates in a Quadrant IV 603 where power is generated, the photovoltaic device 102 (FIG. 2A) is forward biased, and current flows in a reverse direction. When the photovoltaic device 102 (FIG. 5) is not in a power generation mode during the dark period 224 (FIGS. 3A and 3B), the photovoltaic device operates in a Quadrant I 601 where power is consumed, the photovoltaic device 102 (FIG. 2A) is forward biased, and current flows in a forward direction.

Referring again to FIG. 1, an optional power sensor 126 can be utilized to communicate a detected power output or voltage to the processor 122, which can then cause the forward bias $V_{BIAS}$ 250 (FIG. 5) to be applied or ended in response thereto. Alternatively or additionally, a table of sunrise and sunset times for a given location could be stored in the memory 124 (FIG. 1), with the forward bias $V_{BIAS}$ 250 (FIG. 5) being enabled at sunset and disabled at sunrise. The table could include sunrise and sunset times for every day of the year, or the sunset and sunrise times could be specified as a weekly or monthly average, depending on the specifics of a given implementation.

The forward bias $V_{BIAS}$ 250 can be applied, for instance, by applying a forward biasing current $I_{BIAS}$ to the electrodes 132, 134 of the photovoltaic device 102, or (as described previously) by applying a constant voltage $V_{BIAS}$ 250 to the photovoltaic device 102, or by applying power to the photovoltaic device 102. When a constant forward biasing current $I_{BIAS}$ is applied, the applied voltage $V_{BIAS}$ 250 can change due to the dark soak effect. During the night, there is no discernible irradiance. Assuming that a constant current is applied to the photovoltaic device 102 throughout the night, the only way that the voltage $V_{BIAS}$ 250 can change during the night is as a result of photovoltaic device 102 instabilities (the dark soak effect). With regard to cloudy periods that occur during daylight hours, the irradiation drops, but the voltage does not drop very much, so significant forward bias is maintained across the photovoltaic device 102. Accordingly, it may not be necessary to apply an additional forward bias to the photovoltaic device 102 during cloudy periods to prevent dark soak during. The applied voltage (forward bias $V_{BIAS}$ 250), forward biasing current $I_{BIAS}$, or power can be either constant or variable.

The forward biasing current $I_{BIAS}$ can be applied as a percentage of a maximum current that is generated when the power output $P_G$ of the photovoltaic cell 102 is at its daily maximum. The forward biasing current $I_{BIAS}$ can be applied from about 0.01% to about 1% of the maximum daily current at the maximum daily power output, or in an amount of from about 0.02% to about 0.8% of the maximum daily current at the maximum daily power output, or in an amount of from about 0.03% to about 0.5% of the maximum daily current at the maximum daily power output. In some embodiments, the forward biasing current $I_{BIAS}$ can be in an amount ranging from about 0.2% to about 0.8% of the maximum daily current at the maximum daily power output, or in an amount ranging from about 0.05% to about 0.5% of the maximum daily current at the maximum daily power output. In some embodiments, the forward biasing current $I_{BIAS}$ can be in an amount of about 1% of the maximum daily current at the maximum daily power output. Applied forward biasing current $I_{BIAS}$ can be constant, or it can be varied. If the applied forward biasing current $I_{BIAS}$ is varied, it can optionally be varied using an appropriate algorithm.

Alternatively or additionally, the forward bias $V_{BIAS}$ 250 can be applied, for instance, by controlling a forward bias voltage directly across the terminals 132, 134 of the photovoltaic device 102. The forward bias voltage can be applied as a percentage of a maximum daily voltage that occurs when the power output $P_G$ of the photovoltaic cell 102 is at its daily maximum. The forward bias voltage can be, for instance, in the range of from about 40% to about 95% of the maximum daily voltage at the maximum daily power output, or from about 50% to about 90% of the maximum daily voltage at the maximum daily power output, or from about 60% to about 75% of the maximum daily voltage at the maximum daily power output. The applied voltage can be constant, or it can be varied. If the applied voltage is varied, it can optionally be varied according to an appropriate algorithm.

Alternatively or additionally, the forward bias $V_{BIAS}$ 250 can be applied, for instance, by controlling a power consumed by the photovoltaic device 102. The applied power can be applied as a percentage of the power output $P_G$ of the photovoltaic cell 102 when this power output is at its daily maximum. The applied power can be, for instance, in the range of from about 0.01% to about 10% of the maximum daily power output, or from about 0.02% to about 8% of the maximum daily power output, or from about 0.05% to about 6% of the maximum daily power output, or from about 0.1% to about 4% of the maximum daily power output. The applied power can be constant, or it can be varied. If the applied power is varied, it can optionally be varied according to an appropriate algorithm.

As one non-limiting example, a forward current of about 50 μA/cm² can be applied to the photovoltaic device 102 during the night but not during the day. As described in the examples herein, this method has been demonstrated to yield a net energy gain of about 2.5-4.5% on a photovoltaic device with a CdTe-based absorber having a Group V dopant.

The system 100 can include an optional power source, or an optional energy storage device, or both. The power source, or the energy storage device, can be controlled by the processor 122 to apply a predetermined electrical bias to the photovoltaic device 102. The power source or energy storage device can be configured to provide any of a variety of electrical voltages and currents, such as a constant voltage, a constant current, a variable voltage, a variable current, or any combination thereof.

The techniques described herein can be advantageously utilized in solar power systems equipped with energy storage. The power source can be configured to apply a forward bias to the photovoltaic device 102, or to the strings 106. The power source can be electricity from the grid 120, or supplied by a generator, or can be any other source of electrical energy. The energy storage device can be, for example, a battery or an array of batteries. The energy storage device can be utilized to store the electrical energy used to apply the forward bias. For example, a portion of the power produced by the photovoltaic device 102 or the strings 106 during the daytime can be transferred to the energy storage device and stored therein. The energy storage device can then supply the stored energy for the forward bias applied to the photovoltaic device 102, or the strings 106, at nighttime. While it is not necessary to utilize an energy storage device in order to apply the forward bias, the use of the energy storage device in this manner can make the system 100 more self-sustainable.

Referring to FIG. 5, in some embodiments, the voltage $V_G$ of the photovoltaic device 102 can be prevented from dropping below a certain percentage of the maximum power voltage $V_{MP}$ (FIG. 2B) of the photovoltaic device 102 (FIGS. 1 and 5). For example, in some embodiments, the forward bias $V_{BIAS}$ 250 can be applied to the photovoltaic device 102 such that the voltage across terminals 132 and 134 of the photovoltaic device 102 does not vary from being within about 30% of the $V_{MP}$. In other embodiments, the forward bias $V_{BIAS}$ 250 can be applied to the photovoltaic device 102 such that the voltage across terminals 132 and 134 of the photovoltaic device 102 does not vary from being within about 20% of the $V_{MP}$. In other embodiments, the forward bias $V_{BIAS}$ 250 can be applied to the photovoltaic device 102 such that the voltage across terminals 132 and 134 of the photovoltaic device 102 does not vary from being within about 10% of the $V_{MP}$.

Referring again to FIG. 1, the system 100 can include algorithms and software for prediction of the energy yield for the photovoltaic device 102 taking into account the dark soak effect described previously. The processor 122 can automate the biasing for the forward bias $V_{BIAS}$ 250 based on the power output $P_G$ detected by a power sensor and according to the algorithms. In this manner, the forward bias $V_{BIAS}$ 250 (FIG. 5) applied during dark conditions can be improved.

Without wishing to be bound by theory, it is believed that reversible efficiency transients may be responsible for the dark soak effect described herein. The physical nature of these transients is the redistribution of electrically active centers, leading to the accumulation of a net negative charge at or near a p-n junction of the photovoltaic device 102. This accumulation can result in a reduced (or even reversed) electric field near the junction, which introduces voltage-dependent collection losses, and changes the occupancy of interface states. As a result, suppression of fill factor and $V_{OC}$ (FIG. 2B) can occur. The driving force for this accumulation may be the difference between electrostatic potential distribution in a photovoltaic device 102 during the illuminated period 222 (FIG. 3A), versus during the dark period 224. During the illuminated period 222, the light-generating potential can reduce the potential difference across the photovoltaic device 102 (FIGS. 2A and 5). However, during the dark period 224 (FIG. 3A), the potential difference across the photovoltaic device 102 (FIGS. 2A and 5) can increase. This potential difference can drive the accumulation of a net negative charge, which can suppress efficiency. When the forward bias $V_{BIAS}$ 250 (FIG. 5) is applied during the dark period 224 (FIG. 3A), the forward bias can reduce this potential difference.

Maintaining a high enough forward bias $V_{BIAS}$ 250 (FIG. 5) during the dark period 224 (FIG. 3A) consumes energy. However, a higher applied forward bias $V_{BIAS}$ 250 (FIG. 5) can result in a higher starting efficiency during the subsequent illuminated period 222 (FIG. 3A), fostering a faster efficiency recovery and a higher peak efficiency for the photovoltaic device 102 (FIG. 5). The techniques described herein can be applied to the photovoltaic device 102 to provide a positive net energy gain, which can be defined by an energy gain due to the improved efficiency after applying the forward bias $V_{BIAS}$ 250, minus the energy cost for maintaining the forward bias $V_{BIAS}$ 250 during the time in which the power output $P_G$ is below the threshold level. This technique is particularly advantageous when used with a photovoltaic device 102 that exhibits a substantial efficiency decay during the dark period 224 (FIG. 3A) and a slow recovery during the subsequent illuminated period 222.

Dopants can affect the reversible transients of the dark soak effect in the photovoltaic device 102 (FIG. 5). Likewise, certain treatments such as $CdCl_2$ annealing treatments, can also affect the reversible transients in the photovoltaic device 102. The present disclosure allows for a photovoltaic device 102 which has a strong or substantial dark soak effect, such as some photovoltaic devices having Group V doping, to be used with improved efficiency in actual day and night conditions.

EXAMPLES

A photovoltaic device 102 composed of an As-doped solar cell was used to evaluate applied forward bias $V_{BIAS}$ 250 during the dark period 224 (FIG. 3A). The photovoltaic device 102 (FIG. 5) had about 2% absolute efficiency decay during a 12 hour, 35° C. dark soak without a forward bias being applied. Day/light stress tests were performed using 12 hour, 35° C. dark soaks ("DS") with the applied forward bias $V_{BIAS}$ 250, and 12 hour, 55° C. Maximum Power Point (MPP) light soaks at $P_{MAX}$ (FIG. 2B) with no bias, using different dark soak forward bias levels of 0.0 V, 0.4 V, and 0.6 V. After a 0.6 V dark bias (~50 μA/cm² positive current), a 2.5% relative net energy yield gain was obtained during the following MPP light soak step. Shorter MPP light soak steps resulted in higher net energy yield gain, up to 4.5%. Maintaining the forward bias during the subsequent dark soak steps gradually increased the energy yield because the photovoltaic device reached higher peak efficiencies during the following MPP light soak steps.

Figure 7:
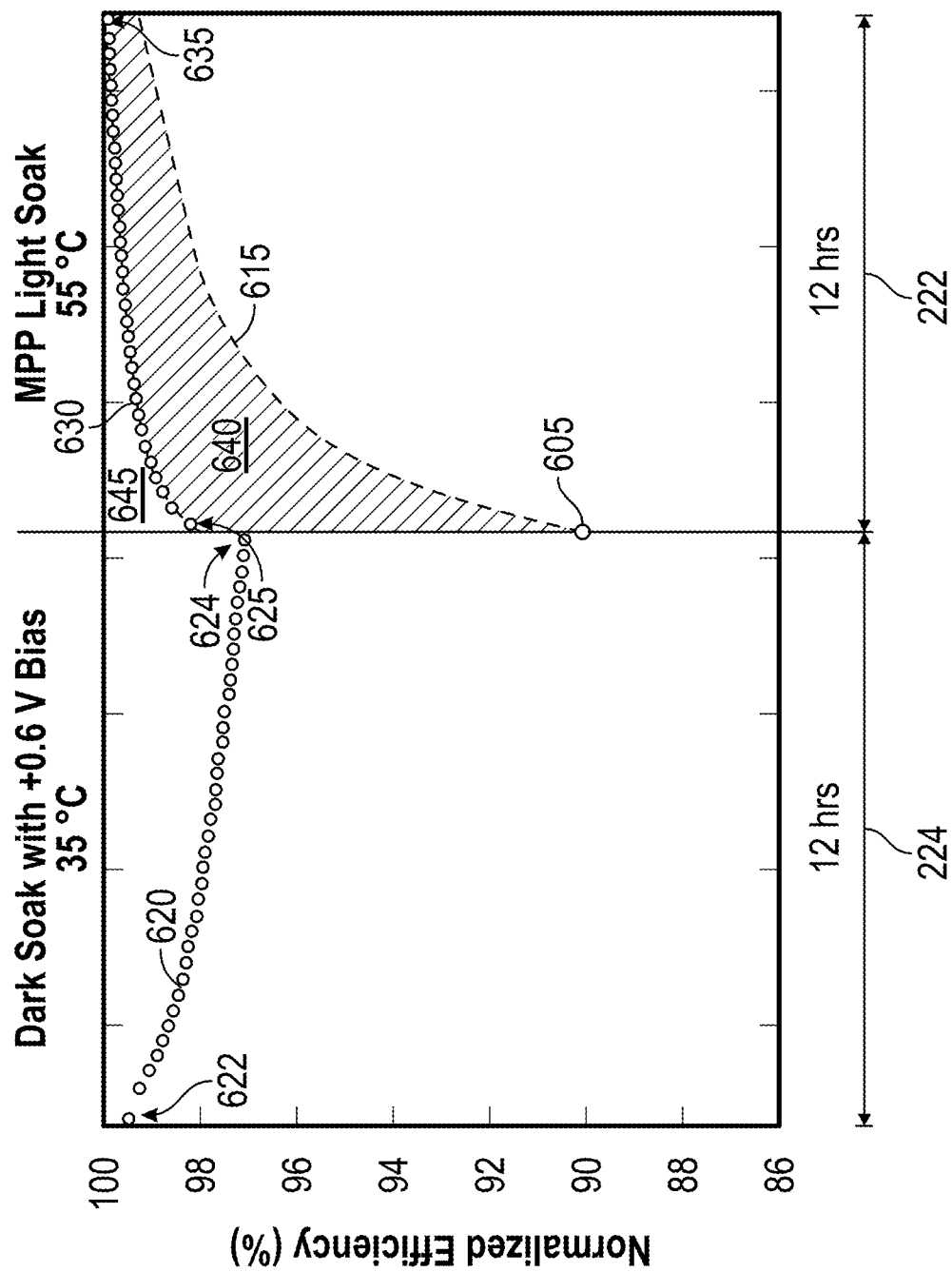
FIG. 7 is a graph comparing the efficiency of a photovoltaic device during an illuminated period, with and without forward bias being applied during a dark period that immediately precedes the illuminated period.

FIG. 7 is a graph comparing the efficiency of the photovoltaic device 102 (FIG. 5) during the illuminated period 222 (FIG. 7), with and without forward bias $V_{BIAS}$ 250 being applied during an immediately preceding dark period 224 (FIG. 7). In the absence of forward bias $V_{BIAS}$ 250 (FIG. 5) being applied during the dark period 224 (FIG. 7), a reduced energy yield is experienced during the subsequent illuminated period 222 (FIG. 7). This reduction is due to the efficiency decay of the photovoltaic device 102 (FIG. 5) each night. When the forward bias $V_{BIAS}$ 250 is applied during the dark period 224 (FIG. 7), an energy yield gain is provided during the subsequent illuminated period 222. A first curve 620 depicts a first normalized efficiency of the photovoltaic device 102 (FIG. 5) during the dark period 224 (FIG. 7). A second curve 615 depicts a second normalized efficiency of the photovoltaic device 102 (FIG. 5) during the subsequent illuminated period 222 (FIG. 7) when no forward bias $V_{BIAS}$ 250 was applied to the photovoltaic device 102 during the immediately preceding dark period 224 (FIG. 7). A third curve 630 depicts a third normalized efficiency of the photovoltaic device 102 (FIG. 5) during the subsequent illuminated period 222 (FIG. 7) when a forward bias $V_{BIAS}$ 250 of +0.6 volts was applied to the photovoltaic device 102 during the immediately preceding dark period 224 (FIG. 7).

A point 625 on the third curve 630 indicates a relatively high normalized efficiency upon commencement of the illuminated period 222. For purposes of illustration, the relatively high normalized efficiency is 98% in the present example. By contrast, a point 605 on the second curve 615 indicates a relatively low normalized efficiency upon commencement of the illuminated period 222. For purposes of illustration, the relatively low normalized efficiency is 90% in the present example.

The photovoltaic device 102 (FIG. 5) reaches a peak efficiency at a point 635 on the third curve 630. A first shaded region 645 represents a first amount of energy lost during the illuminated period 222 with forward bias $V_{BIAS}$ 250 (FIG. 5) having previously been applied to the photoelectric device 102 during the immediately preceding dark period 224 (FIG. 7). If forward bias was not applied to the photoelectric device during the immediately preceding dark period 224, then energy in both the first shaded region 645 as well as a second shaded region 640 is lost.

Figure 8A:
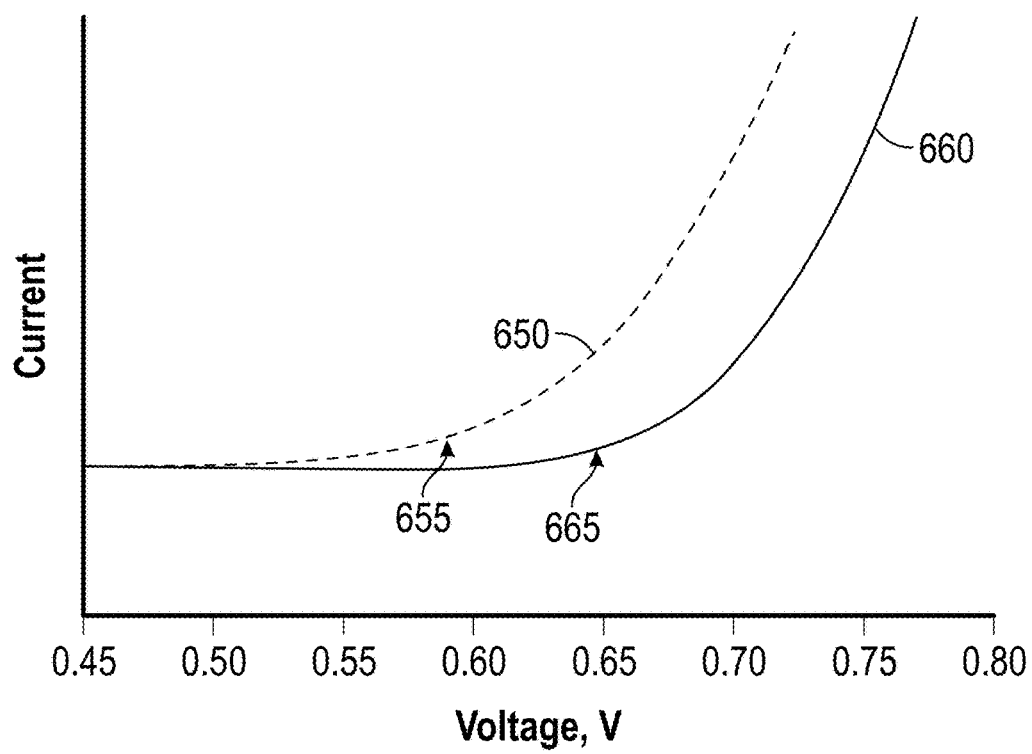
FIG. 8A shows a set of current-voltage (IV) curves corresponding to the normalized efficiency graph of FIG. 7, with no forward bias being applied to a photovoltaic device during a dark period.

FIG. 8A shows a set of current-voltage (IV) curves corresponding to the normalized efficiency graph of FIG. 7 with no forward bias being applied to the photovoltaic device 102 during the dark period 224. A first (solid) IV curve 660 (FIG. 8A) corresponds to the point 622 in FIG. 7, at the commencement of the dark period 224. A second (dotted) IV curve 650 (FIG. 8A) corresponds to the point 624 in FIG. 7, at the termination of the dark period 224 and the commencement of the illuminated period 222. Observe the degradation in IV behavior from the first IV curve 660 to the second IV curve 650 when no forward bias is applied to the photovoltaic device 102 during the dark period 224. Point 655 represents a voltage of maximum power ($V_{MP}$) on the curve 650, and point 665 represents the $V_{MP}$ on the curve 660.

Figure 8B:
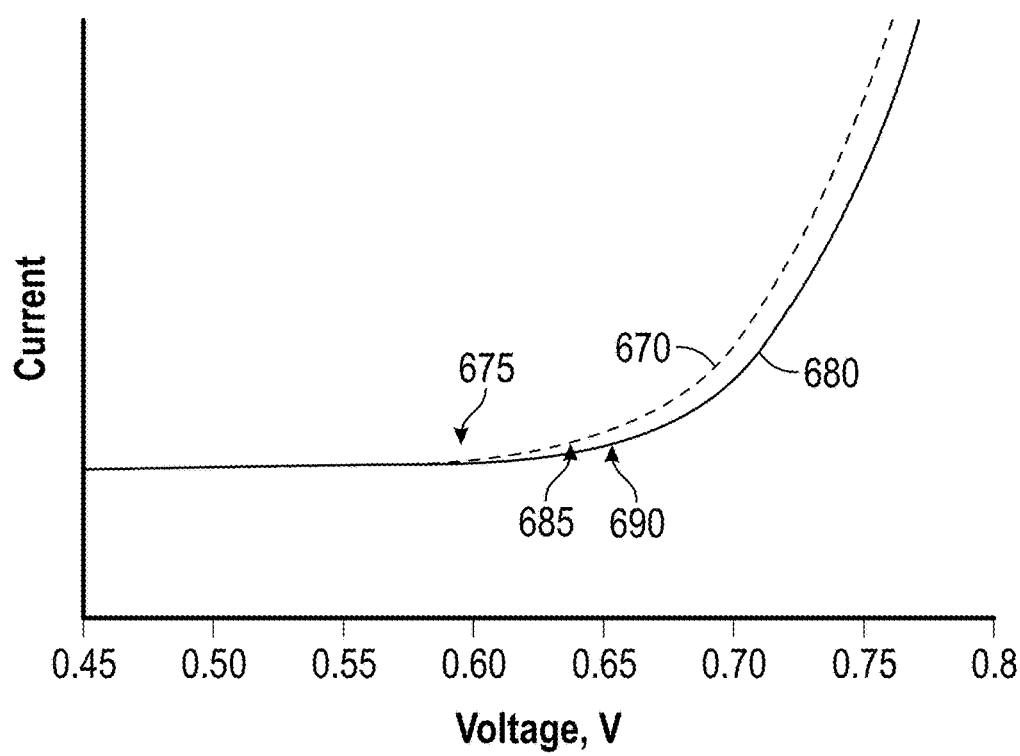
FIG. 8B shows a set of current-voltage (IV) curves corresponding to the normalized efficiency graph of FIG. 7, with a forward bias being applied to the photovoltaic device during the dark period.

FIG. 8B shows a set of current-voltage (IV) curves corresponding to the normalized efficiency graph of FIG. 7 with the forward bias $V_{BIAS}$ 250 (FIG. 5) being applied to the photovoltaic device 102 during the dark period 224. A first (solid) IV curve 680 (FIG. 8B) corresponds to the point 622 in FIG. 7, at the commencement of the dark period 224. A second (dotted) IV curve 670 (FIG. 8B) corresponds to the point 624 in FIG. 7, at the termination of the dark period 224 and the commencement of the illuminated period 222. Observe that the IV behavior is better maintained, relative to the graph of FIG. 8A, when the forward bias $V_{BIAS}$ 250 (FIG. 5) is applied to the photovoltaic device 102 during the dark period 224, as represented by the first and second IV curves 680, 670 of FIG. 8B. A point 675 indicates the forward bias $V_{BIAS}$ 250 voltage that was applied during the dark period 224. A point 685 represents a voltage of maximum power ($V_{MP}$) on the curve 670. A point 690 represents the $V_{MP}$ of the curve 680.

Figure 9:
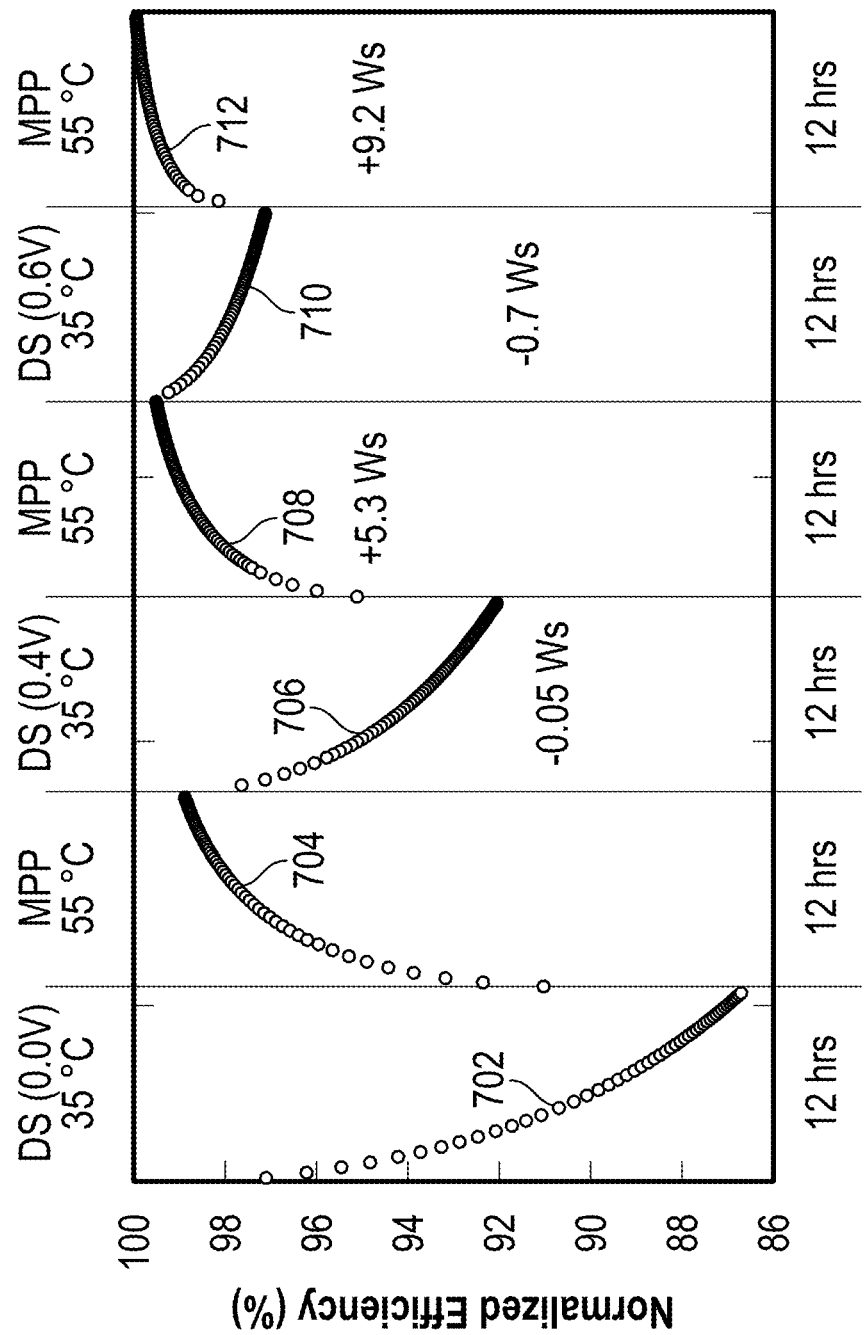
FIG. 9 is a set of graphs illustrating normalized efficiency of a photovoltaic device over the course of a plurality of light and dark cycles, under conditions of no forward bias applied during a dark cycle, a forward bias of 0.4 V applied during a dark cycle, or a forward bias of 0.6 V applied during a dark cycle.

FIG. 9 shows a graph of normalized efficiency over the course of six 12-hour light and dark cycles, applying no forward bias, a forward bias $V_{BIAS}$ 250 (FIG. 5) of 0.4 V, or a forward bias $V_{BIAS}$ 250 of 0.6 V during the dark period 224 (FIG. 7). A first curve 702 (FIG. 9) shows normalized efficiency of the photovoltaic device 102 (FIG. 5) during a 12-hour dark soak, with no forward bias being applied during the dark period 224 (FIG. 7). A second curve 704 (FIG. 9) shows the normalized efficiency during a subsequent 12-hour light period 222 (FIG. 7). A third curve 706 (FIG. 9) shows the normalized efficiency during a 12-hour dark soak (represented by the dark period 224, FIG. 7) during which a forward bias $V_{BIAS}$ 250 (FIG. 5) of 0.4 V was applied to the photovoltaic device 102. A fourth curve 708 (FIG. 9) shows the normalized efficiency during a subsequent 12-hour light cycle (represented by the light period 222, FIG. 7). A fifth curve 710 (FIG. 9) shows the normalized efficiency during a 12-hour dark soak (represented by the dark period 224, FIG. 7) during which a forward bias $V_{BIAS}$ 250 (FIG. 5) of 0.6 V was applied to the photovoltaic device 102. A sixth curve 712 (FIG. 9) shows the normalized efficiency during the subsequent 12-hour light cycle represented by the light period 222 of FIG. 7.

A substantial energy gain is realized for the fourth and sixth curves 708 and 712 (FIG. 9), where the forward bias $V_{BIAS}$ 250 (FIG. 5) was applied during an immediately preceding dark cycle represented, respectively, by the third and fifth curves 706 and 710 (FIG. 9). A 5.3 Ws gain was realized following the 0.4 V forward bias for $V_{BIAS}$ 250 (FIG. 5), which consumed 0.05 Ws to apply, and a 9.2 Ws gain was realized following the 0.6 V forward bias for $V_{BIAS}$ 250, which consumed 0.7 Ws to apply.

Figure 10:
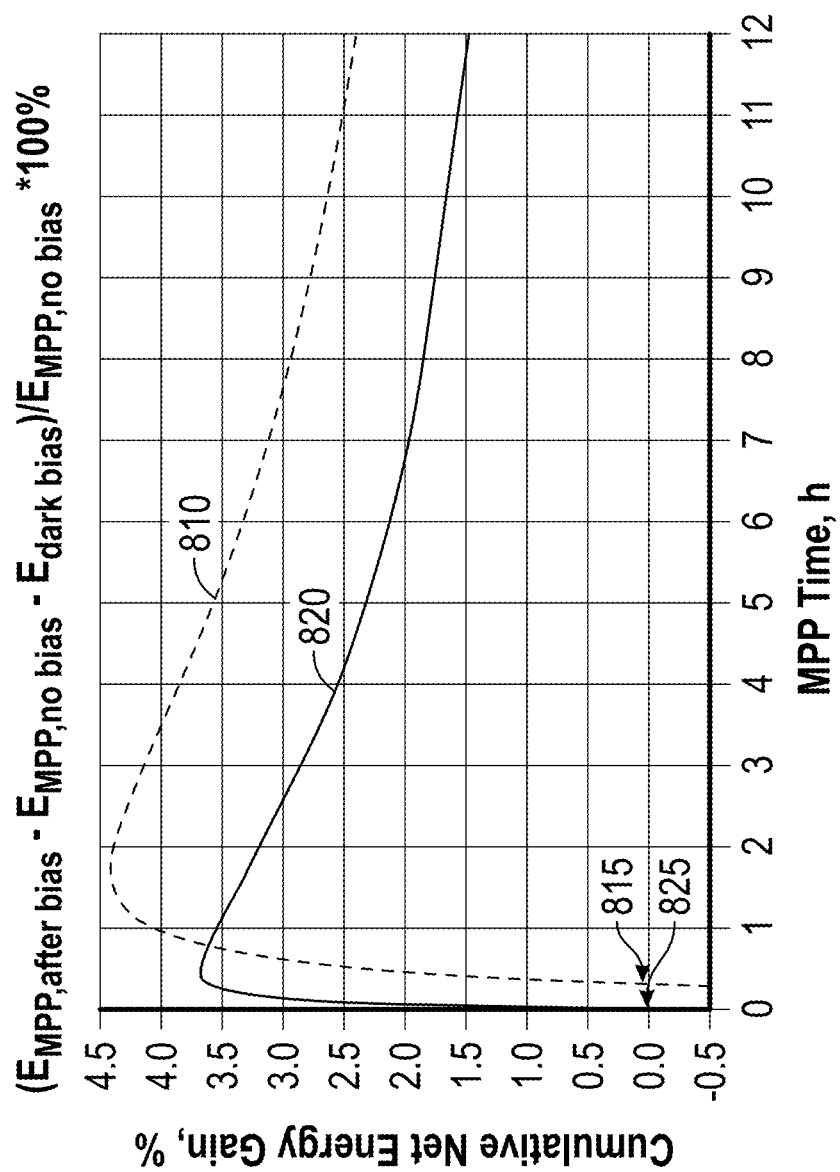
FIG. 10 illustrates a positive net energy yield gain for a photovoltaic device that is achieved by applying a forward bias to the photoelectric device during the dark period.

FIG. 10 illustrates a positive net energy yield gain for a photovoltaic device that is achieved by applying a forward bias to the photoelectric device during the dark period 224 (FIG. 7). A first curve 810 (FIG. 10) demonstrates a first cumulative net energy gain when a first forward bias of 0.6 V for $V_{BIAS}$ 250 (FIG. 5) is applied during the dark period 224 (FIG. 7). A second curve 820 (FIG. 10) demonstrates a second cumulative net energy gain when a second forward bias of 0.4 V for $V_{BIAS}$ 250 (FIG. 5) is applied during the dark period 224 (FIG. 7). The first and second curves 810 and 820 (FIG. 10) take into account the energy consumed to apply the forward bias $V_{BIAS}$ 250 (FIG. 5) to the photovoltaic device 102, and the resulting improvement in efficiency during the immediately subsequent illuminated period 222 (FIG. 7).

At a point 825 (FIG. 10), the second curve 820 turns positive, indicating a positive net energy gain, after about 2 minutes of maximum power point (MPP) time. At a point 815, the first curve 810 turns positive, indicating a positive net energy gain, after about 20 minutes of MPP time. Thus, the energy payback time—that is, the amount of time it took for the photovoltaic device 102 (FIG. 5) to reach a cumulative net energy gain following the dark soak with forward bias—for the 0.4 V forward bias was 2 minutes of the MPP light soak step, and the energy payback time for the 0.6 V forward bias was 20 minutes of the MPP light soak step.

FIG. 10 shows an experimentally demonstrated positive net energy yield gain from forward biasing during the dark period 224 (FIG. 7). The net energy yield gain is calculated as $(E_{MPP,\ after\ bias} - E_{MPP,\ no\ bias} - E_{dark\ bias})/E_{MPP,\ no\ bias} * 100\%$, where MPP is the maximum power point, $E_{MPP}$ is the energy yield, and $E_{dark\ bias}$ is the energy spent for applying the forward bias in the dark.

It is noted that the terms "substantially" and "about" can be utilized herein to represent the inherent degree of uncertainty that can be attributed to any quantitative comparison, value, measurement, or other representation. These terms are also utilized herein to represent the degree by which a quantitative representation can vary from a stated reference without resulting in a change in the basic function of the subject matter at issue.

A method for enhancing the efficiency of a photovoltaic device, in one aspect, may comprise operating the photovoltaic device in a dark bias mode by applying a forward biasing current to the photovoltaic device during a dark period characterized by an insufficient amount of irradiance being received by the photovoltaic device to produce a useful amount of generated power; and subsequently operating the photovoltaic device in a power generation mode during an illuminated period characterized by a sufficient amount of irradiance being received by the photovoltaic device to produce a useful amount of generated power, wherein the forward biasing current is not applied to the photovoltaic device, and wherein the photovoltaic device produces a generated current in a direction opposite to that of the forward biasing current that was applied during the dark period.

An apparatus, in another aspect, may comprise a photovoltaic device operatively coupled to a processor. The processor is programmed to operate the photovoltaic device in a dark bias mode by applying a forward biasing current to the photovoltaic device during a dark period characterized by an insufficient amount of irradiance being received by the photovoltaic device to produce a useful amount of generated power. The processor is programmed to operate the photovoltaic device in a power generation mode during an illuminated period subsequent to the dark period, the illuminated period characterized by a sufficient amount of irradiance being received by the photovoltaic device to produce a useful amount of generated power, wherein the forward biasing current is not applied to the photovoltaic device, and wherein the photovoltaic device produces a generated current in a direction opposite to that of the forward biasing current that was applied during the dark period.

According to the embodiments provided herein, a method for operating a photovoltaic device includes detecting a power output of the photovoltaic device. The photovoltaic device has a maximum power output defined by a current and a voltage at the maximum power output. Optionally, the photovoltaic device has a maximum daily maximum power output defined by a maximum of the voltage at the maximum power output over a desired number of days, and a maximum daily current at the maximum power output defined by a maximum of the current at the maximum power output over a desired number of days. A forward biasing current is applied to the photovoltaic device in response to detecting a decrease in the detected power output. The forward biasing current is ended in response to detecting an increase in the detected power output.

According to any of the embodiments provided herein, the forward biasing current is provided by applying a forward current in an amount of from about 0.01% to about 1% of the current at the maximum power output of the photovoltaic device. According to any of the embodiments provided herein, the forward biasing current is provided in an amount of from about 0.01% to about 1% of the daily maximum current at the maximum power output.

According to any of the embodiments provided herein, the forward biasing current is provided using a forward bias voltage in the range of from about 40% to about 95% of the voltage at the maximum power output. According to any of the embodiments provided herein, the forward biasing current is provided using a forward bias voltage in the range of from about 40% to about 95% of maximum daily voltage at the maximum power output.

According to any of the embodiments provided herein, the forward biasing current is provided by applying a DC power to the photovoltaic device in the range of from about 0.01% to about 10% of the maximum power output. According to any of the embodiments provided herein, the forward biasing current is applied using a DC power supply in the range of from about 0.01% to about 10% of the maximum daily maximum power output.

According to any of the embodiments provided herein, a method for operating a photovoltaic device can include the photovoltaic device comprising a solar cell having an absorber layer comprising cadmium and tellurium. In some embodiments, the solar cell comprises a Group V dopant.

According to any of the embodiments provided herein, a method for operating a photovoltaic device includes the output power or the output voltage of the photovoltaic device being detected by a power sensor. In some embodiments, the forward biasing current is applied from a power source by a processor communicatively coupled to the power source and the power sensor.

According to any of the embodiments provided herein, a method for operating a photovoltaic device includes applying a forward biasing current to the photovoltaic device during the dark period that is equivalent to an amount of current that exists when the photovoltaic device is producing about 50% to about 90% of the maximum daily maximum power output during the illuminated period.

According to any of the embodiments provided herein, a method for operating a photovoltaic device includes applying a forward biasing current to the photovoltaic device during the dark period that is equivalent to an amount of current that exists when the photovoltaic device is producing about 60% to about 75% of the maximum daily maximum power output during the illuminated period.

According to any of the embodiments provided herein, a method for operating a photovoltaic device includes applying a forward biasing current to the photovoltaic device by applying a DC power in the range of from about 0.02% to about 8% of the maximum power output of the photovoltaic device. According to any of the embodiments provided herein, a method for operating a photovoltaic device includes applying a forward biasing current using an applied DC power in the range of from about 0.02% to about 8% of the maximum daily maximum power output of the photovoltaic device.

According to any of the embodiments provided herein, a method for operating a photovoltaic device includes applying a forward biasing current comprising an applied DC power in the range of from about 0.05% to about 6% of the maximum power output of the photovoltaic device. According to any of the embodiments provided herein, a method for operating a photovoltaic device includes applying a forward biasing current using an applied DC power in the range of from about 0.05% to about 6% of the maximum daily maximum power output of the photovoltaic device.

According to any of the embodiments provided herein, a method for operating a photovoltaic device includes applying a forward biasing current using an applied DC power in the range of from about 0.1% to about 4% of the maximum power output of the photovoltaic device. According to any of the embodiments provided herein, a method for operating a photovoltaic device includes applying a forward biasing current using an applied DC power in the range of from about 0.1% to about 4% of the maximum daily maximum power output of the photovoltaic device.

According to any of the embodiments provided herein, a method for operating a photovoltaic device includes a forward biasing current applied during nighttime conditions, and ended during daytime conditions.

According to any of the embodiments provided herein, a method for operating a photovoltaic device includes a forward DC biasing current applied for about 12 hours.

According to any of the embodiments provided herein, a method for operating a photovoltaic device includes a forward DC biasing current applied for about 6 hours.

According to any of the embodiments provided herein, a method for operating a photovoltaic device includes providing the photovoltaic device as a solar cell, a photovoltaic module, an array of photovoltaic modules, or a string of an array of photovoltaic modules.

According to any of the embodiments provided herein, a system for operating a photovoltaic device includes a photovoltaic device; a power sensor configured to detect a power output or a voltage of the photovoltaic device; and a processor communicatively coupled to the photovoltaic device and the power sensor; wherein the processor causes a forward biasing current to be applied to the photovoltaic device during a dark period characterized by a lack of illumination, and causes the forward bias to end during an illuminated period characterized by a presence of illumination.

According to any of the embodiments provided herein, a system for operating a photovoltaic device includes the processor controlling a power source to apply and to end the forward biasing current according to power outputs or voltages detected by the power sensor.

According to a further set of embodiments provided herein, the system for operating a photovoltaic device further includes an energy storage device, wherein the energy storage device is configured to store energy generated from the photovoltaic device during an illuminated period, and to deliver stored energy to the photovoltaic device during a dark period.

According to a further set of embodiments provided herein, the system for operating a photovoltaic device further includes the photovoltaic device comprising a solar cell having an absorber layer comprising cadmium and tellurium.

According to a further set of embodiments provided herein, the system for operating a photovoltaic device further includes the photovoltaic device comprising a solar cell doped with a Group V dopant.

According to any of the embodiments provided herein, a system for operating a photovoltaic device includes the photovoltaic device comprising a solar cell, a photovoltaic module, an array of photovoltaic modules, or a string of an array of photovoltaic modules.

While particular embodiments have been illustrated and described herein, it should be understood that various other changes and modifications can be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for enhancing the efficiency of a photovoltaic device, the method comprising:
    operating the photovoltaic device in a dark bias mode by applying a forward biasing current to the photovoltaic device during a dark period characterized by an insufficient amount of irradiance being received by the photovoltaic device to produce a useful amount of generated power; and
    subsequently operating the photovoltaic device in a power generation mode during an illuminated period characterized by a sufficient amount of irradiance being received by the photovoltaic device to produce a useful amount of generated power, wherein the forward biasing current is not applied to the photovoltaic device during the power generation mode, and wherein the photovoltaic device produces a generated current during the power generation mode in a direction opposite to the forward biasing current that was applied during the dark bias mode.

2. The method of claim 1, further comprising sensing a voltage output or a power output of the photovoltaic device in the dark bias mode and, in response to an increase in the power output or the voltage output, operating the photovoltaic device in the power generation mode.

3. The method of claim 2, comprising sensing a voltage output or a power output of the photovoltaic device in the power generation mode and, in response to a decrease in the power output or the voltage output, operating the photovoltaic device in the dark bias mode.

4. The method of claim 3 wherein the photovoltaic device has a maximum generated power, wherein the maximum generated power defines a maximum power current and a maximum power voltage, and wherein the forward biasing current comprises:
    (i) a magnitude of about 0.01% to about 1% of the maximum power current;
    (ii) a forward bias DC voltage in a range of about 40% to about 95% of the maximum power voltage; or
    (iii) an applied power in a range of from about 0.01% to about 10% of the maximum generated power.

5. The method of claim 4, wherein the power output or the voltage output is sensed by a power sensor.

6. The method of claim 4, wherein the forward biasing current is applied from a power source controlled by a processor communicatively coupled to the power source and the power sensor.

7. The method of claim 4, wherein the magnitude of the forward biasing current is from about 0.02% to about 0.8% of the maximum power current.

8. The method of claim 4, wherein the magnitude of the forward biasing current is from about 0.05% to about 0.5% of the maximum power current.

9. The method of claim 4, wherein the forward bias DC voltage of the forward biasing current is in the range of about 50% to about 90% of the maximum power voltage.

10. The method of claim 4, wherein the forward bias DC voltage of the forward biasing current is in the range of about 60% to about 75% of the maximum power voltage.

11. The method of claim 4, wherein the applied power of the forward biasing current is in the range of from about 0.02% to about 8% of the maximum generated power.

12. The method of claim 4, wherein the applied power of the forward biasing current is in the range of from about 0.05% to about 6% of the maximum generated power.

13. The method of claim 4, wherein the applied power of the forward biasing current is in the range of from about 0.1% to about 4% of the maximum generated power.

14. The method of claim 1, wherein the forward biasing current is applied during nighttime conditions, and the forward bias is ended during daytime conditions.

15. The method of claim 1, wherein the forward biasing current is applied for about 12 hours.

16. The method of claim 1, wherein the photovoltaic device comprises a solar cell having an absorber layer comprising cadmium and tellurium.

17. The method of claim 16, wherein the photovoltaic device comprises a Group V dopant.

18. A method for enhancing the efficiency of a photovoltaic device, the method comprising:
   operating the photovoltaic device in a dark bias mode by applying a forward biasing current to the photovoltaic device during a dark period characterized by an insufficient amount of irradiance being received by the photovoltaic device to produce a useful amount of generated power; and
   subsequently operating the photovoltaic device in a power generation mode during an illuminated period characterized by a sufficient amount of irradiance being received by the photovoltaic device to produce a useful amount of generated power, wherein:
      the forward biasing current is not applied to the photovoltaic device during the power generation mode,
      the photovoltaic device produces a generated current during the power generation mode in a direction opposite to the forward biasing current applied during the dark bias mode,
      the photovoltaic device has a maximum generated power during the power generation mode,
      the maximum generated power defines a maximum power current; and
      the forward biasing current has a magnitude from about 0.01% to about 1% of the maximum power current.

19. The method of claim 18, wherein:
   the maximum generated power defines a maximum power voltage; and
   the forward biasing current is applied with a forward bias DC voltage in a range of about 40% to about 95% of the maximum power voltage.

20. The method of claim 19, wherein the forward biasing current is applied with an applied power in a range of from about 0.01% to about 10% of the maximum generated power.

* * * * *